(12) United States Patent
Levy et al.

(10) Patent No.: US 11,588,056 B2
(45) Date of Patent: Feb. 21, 2023

(54) STRUCTURE WITH POLYCRYSTALLINE ACTIVE REGION FILL SHAPE(S), AND RELATED METHOD

(71) Applicant: GLOBALFOUNDRIES U.S. Inc., Santa Clara, CA (US)

(72) Inventors: Mark D. Levy, Williston, VT (US); Siva P. Adusumilli, South Burlington, VT (US); Jagar Singh, Clifton Park, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 86 days.

(21) Appl. No.: 16/992,440

(22) Filed: Aug. 13, 2020

(65) Prior Publication Data

US 2022/0052205 A1    Feb. 17, 2022

(51) Int. Cl.
*H01L 29/786* (2006.01)
*H01L 29/06* (2006.01)
*H01L 29/66* (2006.01)

(52) U.S. Cl.
CPC .... *H01L 29/78672* (2013.01); *H01L 29/0649* (2013.01); *H01L 29/66613* (2013.01)

(58) Field of Classification Search
CPC ........... H01L 29/78672; H01L 29/0649; H01L 29/66613
See application file for complete search history.

(56) References Cited

U.S. PATENT DOCUMENTS

| 5,723,896 A | 3/1998 | Yee et al. |
| 6,611,041 B2 | 8/2003 | Maeda et al. |
| 7,259,103 B2 | 8/2007 | Kim |
| 8,026,131 B2 | 9/2011 | Botula et al. |
| 8,299,537 B2 | 10/2012 | Greco et al. |
| 8,674,472 B2 | 3/2014 | Botula et al. |
| 8,722,508 B2 | 5/2014 | Botula et al. |
| 10,192,779 B1 | 1/2019 | Shank et al. |
| 10,580,893 B2 | 3/2020 | Adusumilli et al. |
| 2011/0131542 A1 | 6/2011 | Botula et al. |
| 2013/0181290 A1 | 7/2013 | Hurwitz et al. |

(Continued)

FOREIGN PATENT DOCUMENTS

EP    1850374 A2 * 10/2007    ....... H01L 21/28273

OTHER PUBLICATIONS

Soo Youn Kim et al., "High Frequency Modeling of Poly-Si Thin-Film Transistors for Low-Cost RF Applications," IEEE Transactions on Electron Devices, Sep. 2012, vol. 59, No. 9, pp. 2296-2301.

(Continued)

*Primary Examiner* — Edward Chin
(74) *Attorney, Agent, or Firm* — Francois Pagette; Hoffman Warnick LLC

(57) ABSTRACT

A structure includes a semiconductor-on-insulator (SOI) substrate including a semiconductor substrate, a buried insulator layer over the semiconductor substrate, and an SOI layer over the buried insulator layer. At least one polycrystalline active region fill shape is in the SOI layer. A polycrystalline isolation region may be in the semiconductor substrate under the buried insulator layer. The at least one polycrystalline active region fill shape is laterally aligned over the polycrystalline isolation region, where provided. Where provided, the polycrystalline isolation region may extend to different depths in the semiconductor substrate.

18 Claims, 3 Drawing Sheets

(56) References Cited

U.S. PATENT DOCUMENTS

| | | | |
|---|---|---|---|
| 2019/0081138 A1* | 3/2019 | Liu | H01L 29/78606 |
| 2019/0131438 A1 | 5/2019 | McPartlin | |
| 2019/0312142 A1* | 10/2019 | Adusumilli | H01L 21/3247 |
| 2019/0363160 A1* | 11/2019 | Adusumilli | H01L 21/76283 |
| 2020/0176304 A1* | 6/2020 | Adusumilli | H01L 21/76224 |
| 2020/0303244 A1* | 9/2020 | Zhang | H01L 21/84 |
| 2020/0373197 A1* | 11/2020 | Lu | H01L 29/0649 |
| 2021/0351066 A1* | 11/2021 | Verma | H01L 21/76205 |
| 2021/0376159 A1* | 12/2021 | Abou-Khalil | H01L 29/78675 |
| 2022/0013551 A1* | 1/2022 | Mun | H01L 27/14616 |
| 2022/0051929 A1* | 2/2022 | Adusumilli | H01L 21/763 |
| 2022/0181501 A1* | 6/2022 | Adusumilli | H01L 21/823412 |

OTHER PUBLICATIONS

Hsin-Hui Hu and Hsin-Ping Huang, "High Frequency Performance of Trigate Poly-Si Thin-Film Transistors by Microwave Annealing," IEEE Electron Device Letters, Apr. 2015, vol. 36, No. 4, pp. 345-347.

Multi-Depth Regions of High Resistivity in a Semiconductor Substrate, U.S. Appl. No. 16/598,064, filed Oct. 10, 2019.

Buried Damage Layers for Electrical Isolation, U.S. Appl. No. 16/806,383, filed Mar. 2, 2020.

Field-Effect Transistors With a Polycrystalline Body in a Shallow Trench Isolation Region, U.S. Appl. No. 16/890,063, filed Jun. 2, 2020.

Structure with Polycrystalline Isolation Region below Polycrystalline Fill Shape(s) and Selective Active Device(s), and Related Method, Filed contemporaneously.

Bulk Semiconductor Structure With a Multi-Level Polycrystalline Semiconductor Region and Method, U.S. Appl. No. 16/992,165, filed Aug. 13, 2020.

* cited by examiner

STRUCTURE WITH POLYCRYSTALLINE ACTIVE REGION FILL SHAPE(S), AND RELATED METHOD

TECHNICAL FIELD

The present disclosure relates to integrated circuit (IC) structures, and more specifically, to various structures including a polycrystalline active region fill shapes, and optionally, a polycrystalline isolation region below the polycrystalline active region fill shape(s), to reduce harmonics and parasitic losses for radio frequency (RF) devices in semiconductor-on-insulator (SOI) applications.

BACKGROUND

In integrated circuit (IC) structures, active devices are electrically isolated by dielectrics. The dielectrics may be provided in a number of locations. Dielectric trench isolations typically laterally isolate active devices. In radio frequency (RF) device applications such as switches, power amplifiers and other devices, additional isolation regions to reduce harmonics and parasitic losses are advantageous. One current approach creates a semiconductor-on-insulator (SOI) substrate with a trap-rich polycrystalline isolation layer between the buried insulator and the semiconductor substrate. The polycrystalline isolation layer is eventually located below the RF active devices to provide additional isolation thereto. In this case, the polycrystalline isolation layer has a uniform depth in the substrate. In another approach, a polycrystalline isolation region is created in the semiconductor substrate (handle wafer) below the devices, after the devices are formed. The process etches a trench between adjacent active devices and through various layers including gate and active region fill shapes, trench isolations and the buried insulator layer, to the semiconductor substrate below. The process then implants a dopant into the semiconductor substrate to create the polycrystalline isolation region, and refills the trench with dielectric, leaving only dielectric over the polycrystalline isolation region. This process is expensive and time consuming and presents a high risk of defects to the active devices.

SUMMARY

An aspect of the disclosure is directed to a structure, comprising: a semiconductor-on-insulator (SOI) substrate including a semiconductor substrate, a buried insulator layer over the semiconductor substrate, and an SOI layer over the buried insulator layer; and at least one polycrystalline active region fill shape in the SOI layer.

Another aspect of the disclosure includes a structure, comprising: a semiconductor-on-insulator (SOI) substrate including a semiconductor substrate, a buried insulator layer over the semiconductor substrate, and an SOI layer over the buried insulator layer; at least one polycrystalline active region fill shape in the SOI layer; a first active device and a second active device, the first and second active devices on opposite sides of the at least one polycrystalline active region fill shape; and a polycrystalline isolation region in the semiconductor substrate under the buried insulator layer, wherein the polycrystalline isolation region extends to a first depth into the semiconductor substrate in a first location, and extends to a second depth into the semiconductor substrate in a second location, wherein the first depth is greater than the second depth.

Another aspect of the disclosure related to a method, comprising: forming a mask including an opening, the opening exposing an area over at least one monocrystalline active region fill shape in a semiconductor-on-insulator (SOI) layer over a buried insulator layer over a monocrystalline semiconductor substrate, wherein each monocrystalline active region fill shape includes a cap thereover; converting each of the at least one monocrystalline active region fill shape to a respective polycrystalline active region fill shape; and removing the mask.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
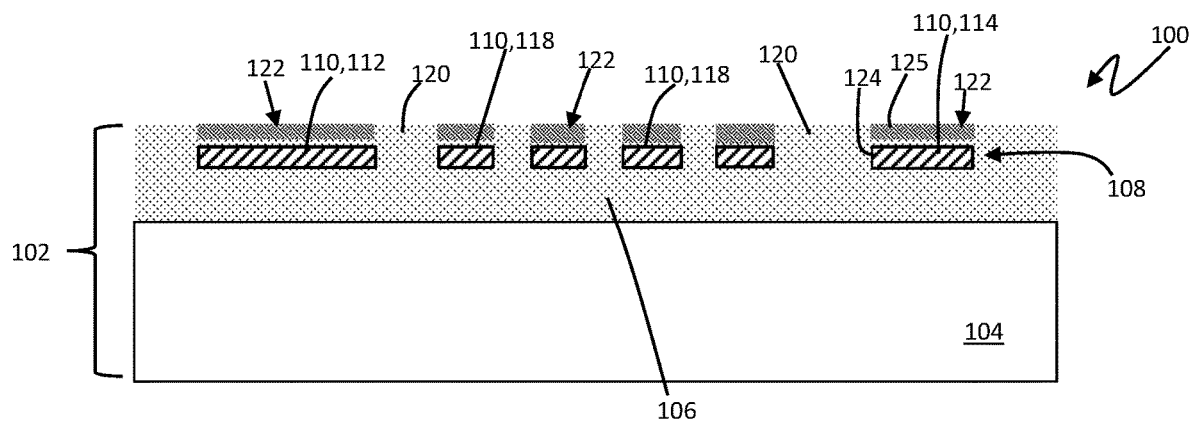
FIG. 1 shows a cross-sectional view of a preliminary structure for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or semiconductor substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure for semiconductor-on-insulator (SOI) substrates. In certain embodiments, such structures may include a polycrystalline isolation region and polycrystalline active region fill shape(s) for reducing harmonics and parasitic losses in, for example, radio frequency (RF) applications. In other embodiments, such structures may include just the polycrystalline active region fill shape(s) for reducing harmonics and parasitic losses in, for example, radio frequency (RF) applications. The SOI substrate includes a semiconductor substrate, a buried insulator layer over the semiconductor substrate, and an SOI layer over the buried insulator layer. In accordance with embodiments of the disclosure, the polycrystalline active region fill shape(s) and the polycrystalline isolation region may be formed by implanting through the monocrystalline active region fill shape(s) and the buried insulator layer into the monocrystalline semiconductor substrate under the buried insulator layer, and subsequent thermal cycles. Where only polycrystalline active region fill shape(s) are used, they may be formed by implanting through just the monocrystalline active region fill shape(s) and perhaps into the buried insulator layer, and subsequent thermal cycles. In any event, the implanting converts the monocrystalline material to crystallographically disordered material, which after subsequent thermal cycle(s), forms polycrystalline active region fill shape(s) and/or a polycrystalline isolation region in the semiconductor substrate. The process thus allows creating the polycrystalline elements in the semiconductor substrate without having to etch a trench, implant and refill the trench, and without having to remove the active region fill shape(s) in the SOI layer. The process also eliminates the expense of manufacturing an SOI substrate with a trap-rich isolation region. Where the polysilicon isolation region is provided, the polycrystalline active region fill shapes are laterally aligned over the polycrystalline isolation region and the polycrystalline isolation region is not under the active devices. Where it is implanted with a number of spaced active region fill shapes in place, the polycrystalline isolation region extends to different depths into the semiconductor substrate.

Referring to the drawings, embodiments of a method according to the disclosure will now be described. FIG. 1 shows a cross-sectional view of a preliminary structure 100. Preliminary structure 100 includes a semiconductor-on-insulator (SOI) substrate 102 including a semiconductor substrate 104, a buried insulator layer 106 over semiconductor substrate 104, and an SOI layer 108 over buried insulator layer 106. Semiconductor substrate 104 and SOI layer 108 include a monocrystalline material such as but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor material may be strained. For example, SOI layer 108 may be strained.

Buried insulator layer 106 may include any suitable dielectric material including but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one embodiment, buried insulator layer 106 includes silicon oxide. SOI substrate 102 may be formed using any now known or later developed semiconductor manufacturing process.

SOI layer 108 is segmented to create a number of monocrystalline active region segments 110 therein. While a particular locations of active region segments 110 will be described, it will be apparent that other locations are possible. FIG. 1 shows forming a first device active region 112 to one side of at least one monocrystalline active region fill shape 118 (hereafter "monocrystalline fill shape(s) 118") and a second device active region 114 to an opposite side of monocrystalline fill shape(s) 118. Hence, SOI layer 108 includes first device active region 112, and second device active region 114. Each of active regions 112, 114 will be eventually used to create an active device. For example, first device active region 112 may be used for a radio frequency (RF) device such as but not limited to a switch or power amplifier, and second device active region 114 may be used for a complementary metal-oxide semiconductor (CMOS) device, such as but not limited to a transistor. Active region segments 110 may be formed in SOI layer 108 using any now known or later developed semiconductor manufacturing technology, e.g., deposition of blanket monocrystalline SOI layer 108, and patterning/etching of the SOI layer.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

SOI layer 108 may also include active region segments 110 in the form of monocrystalline fill shape(s) 118 (four shown, but could be more or less). Active regions 112, 114 (and monocrystalline fill shapes 118) are electrically isolated from one another by one or more trench isolations 120, e.g., a shallow trench isolation. Monocrystalline fill shapes 118 are positioned in an active region layer, i.e., SOI layer 108, in locations to improve pattern density (active and fill) to assist patterning of the active layer (e.g., endpoint detection, slope, critical dimension control, etc.) and planarization of trench isolations 120 (e.g., reduce dishing that could occur in the dielectric of trench isolation 120 during planarization). The dishing can lead to a number of issues in subsequent processing, e.g., misalignment, insufficient fill, non-planarity, etc. Monocrystalline fill shapes 118 can have any lateral shape necessary to provide the desired increased density.

Trench isolations 120 include a trench etched through SOI layer 108 and filled with an insulating material such as oxide, to isolate one region of SOI layer 108 from an adjacent region of thereof, e.g., active regions 112, 114 and adjacent monocrystalline fill shapes 118. Each trench isolation 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In one non-limiting example, trench isolation(s) 120 include the same material as buried insulator layer 106.

Preliminary structure 100 also includes a cap 122 over each active region segment 110. Cap 122 may include a material that is harder than trench isolation 120 material to protect active region segments 110 during subsequent processing. In one non-limiting example, cap 122 may include a silicon oxide layer 124 under a silicon nitride layer 125.

Figure 2:
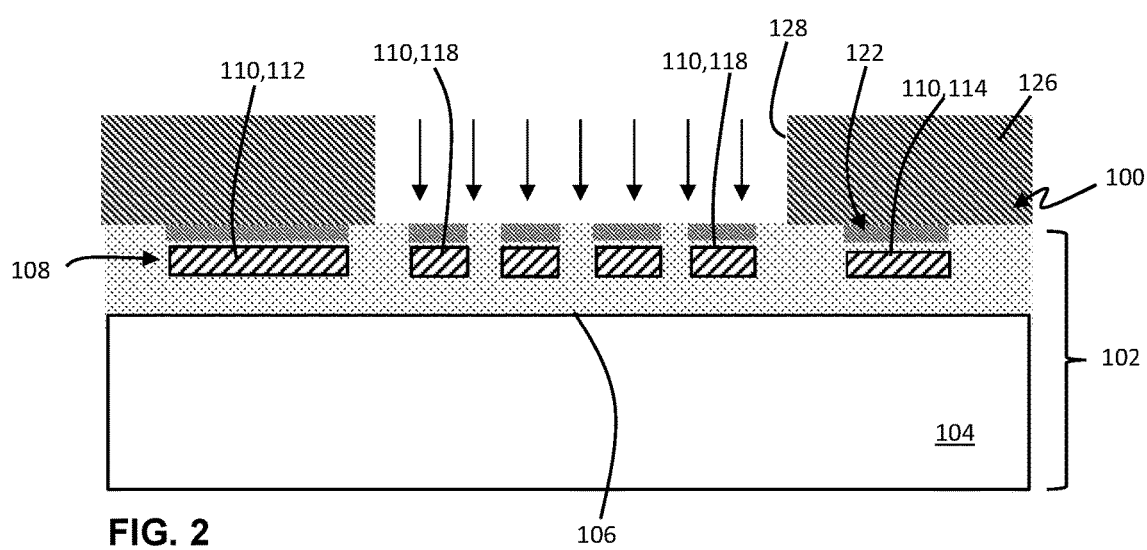
FIG. 2 shows a cross-sectional view of forming a mask and implanting into monocrystalline active region fill shape(s) and a semiconductor substrate, according to embodiments of the disclosure.
Figure 3:
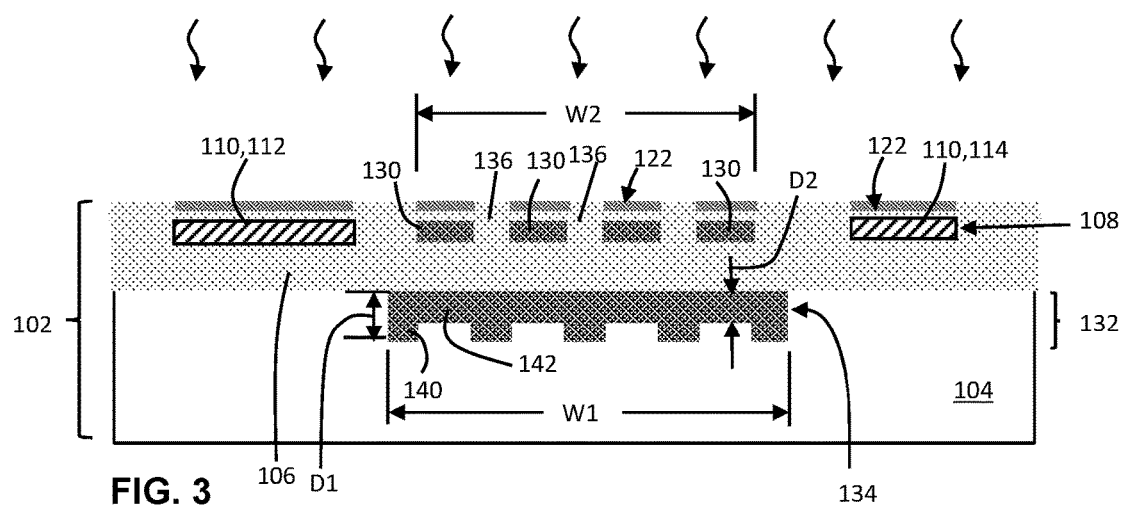
FIG. 3 shows a cross-sectional view of polycrystalline active region fill shapes and a polycrystalline isolation region, according to embodiments of the disclosure.
Figure 4:
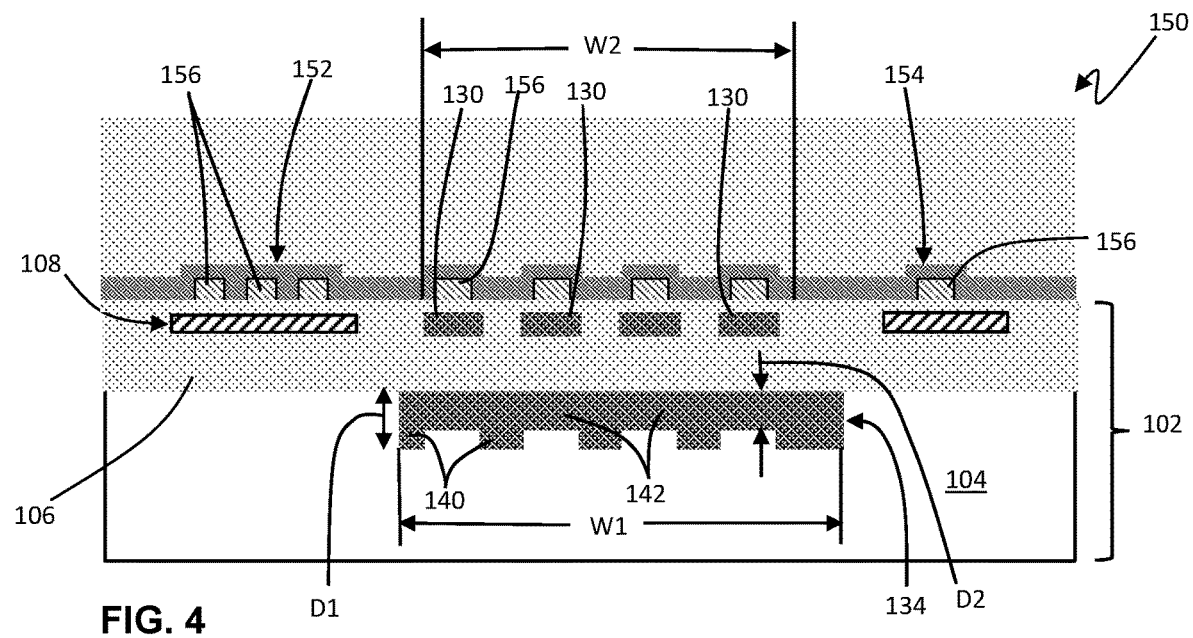
FIG. 4 shows a cross-sectional view of a structure including a polycrystalline isolation region below polycrystalline fill shape(s), according to embodiments of the disclosure.

FIGS. 2-4 show cross-sectional views of a method according to one embodiment of the disclosure in which both polycrystalline active region fill shape(s) and a polycrystalline isolation region are formed. FIG. 2 shows forming a mask 126 over preliminary structure 100. Mask 126 may include any now known or later developed mask material. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Mask 126 includes an opening 128. Opening 128 exposes an area over at least one monocrystalline fill shape 118 in SOI layer 108 over buried insulator layer 106 over monocrystalline semiconductor substrate 104. As noted, each monocrystalline fill shape 118 includes cap 122 thereover. Mask 126 covers first and second active regions 112, 114 in SOI layer 108.

FIGS. 2 and 3 collectively show cross-sectional views of converting each monocrystalline fill shape 118 to a respective polycrystalline active region fill shape 130 and converting an upper portion 132 of monocrystalline semiconductor substrate 104 to a polycrystalline isolation region 134. FIG. 2 shows implanting a dopant (arrows in FIG. 2) into, among other areas, active region segments 110. As illustrated, the dopant is implanted into monocrystalline fill shape(s) 118 and monocrystalline semiconductor substrate 104. Implanting or doping is the process of introducing impurities (dopants) into a material. An ion implanter is typically employed for the actual implantation. An inert carrier gas such as nitrogen is usually used to bring in the impurity source (dopant). A dosage and an energy level appropriate for the particular SOI substrate 102 and desired doping may be specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). For perspective, there are about 1E23 (100,000,000,000,000,000,000,000) atoms of hydrogen and oxygen in a cubic centimeter ($cm^3$) of water. An example of doping is implanting with argon (Ar) with a dosage of between about 1E12 and 1E13 atoms/$cm^2$, and an energy of about 40 to 80 keV to produce a doping level of between 1E17 and 1E18 atoms/$cm^3$. In this case, as shown in FIG. 3, the implanting is carried out to damage the monocrystalline material to which it is applied. FIG. 3 also shows one or more thermal cycle(s), e.g., an anneal indicated by arrows, that re-orders the damaged and disordered crystallographic material into polycrystalline material. The thermal cycle(s) may include one or more intentionally added recrystallization anneal(s) shortly after implant, or the normal high temperature (>600° C.) process(es) associated with semiconductor manufacturing. In this manner, the process converts each monocrystalline fill shape 118 to a respective polycrystalline active region fill shape 130 and converts upper portion 132 of monocrystalline semiconductor substrate 104 to polycrystalline isolation region 134. The dopant implanted may be include any material capable of creating polycrystalline material including but not limited to: germanium (Ge); a noble gas such as argon (Ar) or xenon (Xe); or a combination of the previously listed materials such as Ge—Ar or Ge—Xe.

As shown in FIG. 3, the implanting extends through buried insulator layer 106 and into monocrystalline semiconductor substrate 104, i.e., where mask 126 (FIG. 2) does not cover. Since mask 126 covers first device active region 112 and second device active region 114, polycrystalline isolation region 134 is not under first and second devices 152, 154 (FIG. 4). Cap 122 and monocrystalline fill shape(s) 118 impact the formation of polycrystalline isolation region 134, i.e., by impacting the penetration depth of the implanting. For example, polycrystalline active region fill shape(s) 130 (hereafter "polycrystalline fill shape(s) 130) are laterally aligned over polycrystalline isolation region 134. That is, polycrystalline isolation region 134 extends laterally to the same distance to either side of outermost polycrystalline fill shapes 130. Also, a width W1 of polycrystalline isolation region 134 is wider than a width W2 of polycrystalline fill shape(s) 130 (i.e., from outermost edge of an outermost fill shape to outermost edge of opposing, outermost fill shape). At least two polycrystalline fill shapes 130 (as shown) may have a space 136 therebetween. In this case, the conversion creates a unique shape in polycrystalline isolation region 134 due to polycrystalline fill shapes 130 changing the extent of penetration of the dopant where they exist. As illustrated, the conversion results in upper portion 132 of monocrystalline semiconductor substrate 104 converting to polycrystalline isolation region 134 that extends to a first depth D1 into semiconductor substrate 104. Polycrystalline isolation region 134 may be in a first location laterally aligned with space 136 between at least two polycrystalline fill shapes 130. Polycrystalline isolation region 134 may extend to a second depth D2 into semiconductor substrate 104 in a second location not laterally aligned with space 136 between at least two polycrystalline fill shapes 130. As illustrated, first depth D1 is greater than second depth D2. Hence, polycrystalline isolation region 134 may include deeper regions 140 and shallower regions 142, resulting from the positioning of monocrystalline fill shape(s) 118 (FIG. 2). In the one non-limiting example shown, polycrystalline isolation region 134 includes a sawtooth pattern having alternating deeper regions 140 and shallower regions 142. In conjunction with control of the implanting, the thermal cycle(s) and the selection of dopant, monocrystalline fill shapes 118 can be shaped, spaced and/or positioned in any manner to create polycrystalline isolation region 134 with any desired shape, depth, and/or width. In this manner, the isolating characteristics of polycrystalline isolation region 134 can be customized.

FIG. 3 also shows removing mask 126 (FIG. 3). Mask 126 may be removed using any appropriate removal process, e.g., a wet etch appropriate for the mask material.

FIG. 4 shows a cross-sectional view of a structure 150 according to embodiments of the disclosure, i.e., after subsequent conventional device formation. The subsequent processing may include any now known or later developed front-end-of-line (FEOL) semiconductor manufacturing processes to form devices, such as a first active device 152 and a second active device 154. Subsequent processing (only partially shown) may also include any middle-of-line (MOL) or back-end-of-line (BEOL) processing, e.g., for interconnects. Processing may include, for example, cap removal, source/drain formation, gate 156 formation (active and dummy fill gates over active region fill shapes 130 by gate first or replacement metal gate processing), interlayer dielectric formation and interconnect formation (the last not shown). Active gates 156 are shown to form first active device 152 in the form of, for example, an RF device, and second active device 154 in the form of, for example, a CMOS device.

As shown in FIG. 4, in accordance with one embodiment, structure 150 includes SOI substrate 102, as described herein. Structure 150 also includes polycrystalline fill shape(s) 130 in SOI layer 108, and polycrystalline isolation region 134 in semiconductor substrate 104 under buried insulator layer 106. First active device 152 and second active device 154 are on opposite sides of polycrystalline fill shape(s) 130. In one non-limiting example, first active device 152 may include, for example, an RF device, and second active device 154 may include a CMOS device. In any event, polycrystalline isolation region 134 provides RF isolation of sensitive device structures (e.g., RF switches, power amplifiers, etc.) without the need for aggressive etch/implant and refill processing, significantly reducing complexity, the risk of defects and costs. Polycrystalline isolation region 134 also provides improved passives (inductor, transmission line, metal-insulator-metal (MIM) capacitor) quality (Q) factor by decreasing eddy current in conventional monocrystalline active region fill shapes 118 (FIG. 2).

Structure 150 also has polycrystalline fill shape(s) 130 that are laterally aligned over polycrystalline isolation region 134. In contrast to conventional SOI substrates with a uniform thickness, trap-rich polycrystalline isolation layer between the buried insulator and the semiconductor substrate, polycrystalline isolation region 134 is not under first and second active devices 152, 154 (FIG. 4). As shown in FIG. 3, width W1 of polycrystalline isolation region 134 is wider than a width W2 of polycrystalline fill shape(s) 130. Where at least two at least two polycrystalline fill shapes 130 have space 136 therebetween, polycrystalline isolation region 134 extends to a first depth D1 into semiconductor substrate 104 in a first location laterally aligned with space 136 between at least two polycrystalline fill shapes 130, and extends to a second depth D2 into semiconductor substrate 104 in a second location not laterally aligned with space 136 between the at least two polycrystalline active region fill shapes 130. As indicated, first depth D1 is greater than second depth D2. In one non-limiting example, polycrystalline fill shape(s) 130 and polycrystalline isolation region 134 may include any of the dopants described herein, e.g., argon, xenon, germanium or a combination thereof.

Figure 5:
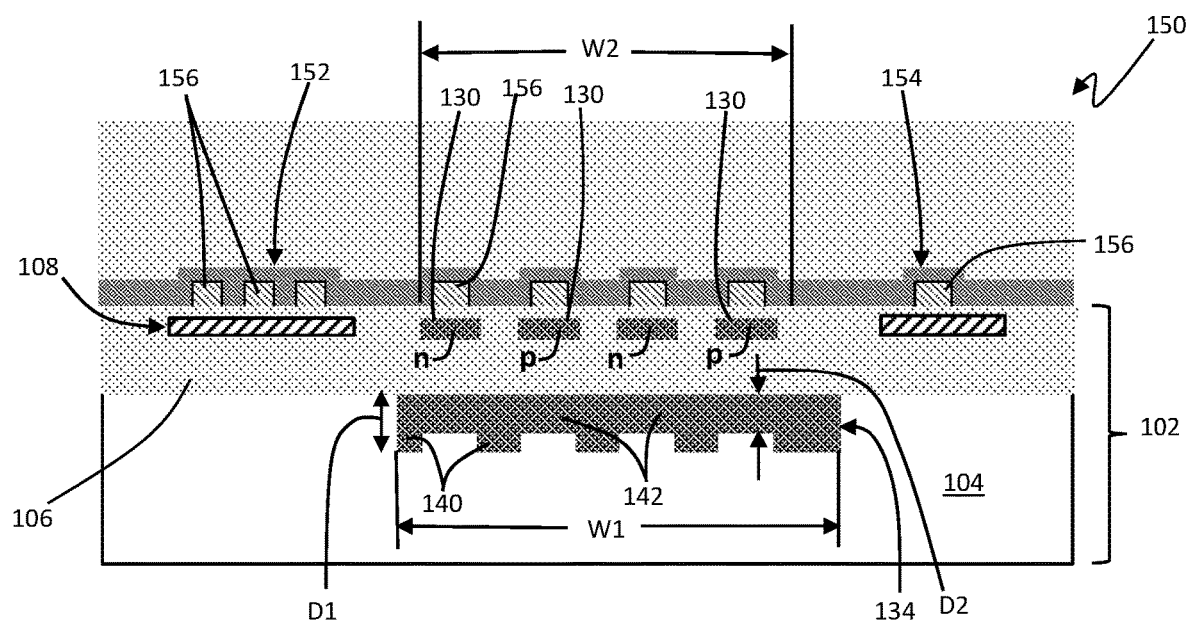
FIG. 5 shows a cross-sectional view of a structure including a polycrystalline isolation region below polycrystalline fill shapes and with alternating dopants in the fill shapes, according to other embodiments of the disclosure.

FIG. 5 shows a cross-sectional view of another embodiment in which at least two polycrystalline active region fill shapes 130 have alternating opposite p-type doping and n-type doping. The doping may be applied in any now known or later developed fashion, e.g., by ion implantation during source/drain formation. In non-limiting examples, p-type dopants may include: boron (B), indium (In); and n-type dopants may include: phosphorous (P) arsenic (As), antimony (Sb). The alternating doping provides harmonics improvement by alternating S/D implant type between fill shapes. In any event, each fill shape 130 is separated by dielectric, creating alternating islands of p-type doping and n-type doping. In other embodiments, each polycrystalline fill shape 130 may include its own p/n junction, creating p/n junction islands. The dopants may be formed in the fill shapes in any now known or later developed manner, e.g., masked ion implanting.

Figure 6:
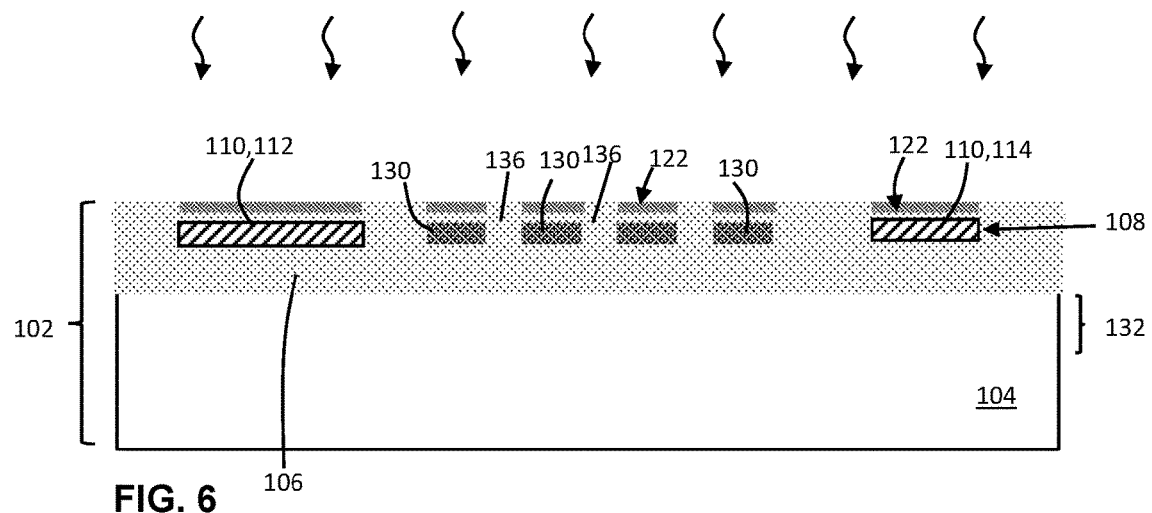
FIG. 6 shows a cross-sectional view of polycrystalline active region fill shape(s), according to other embodiments of the disclosure.
Figure 7:
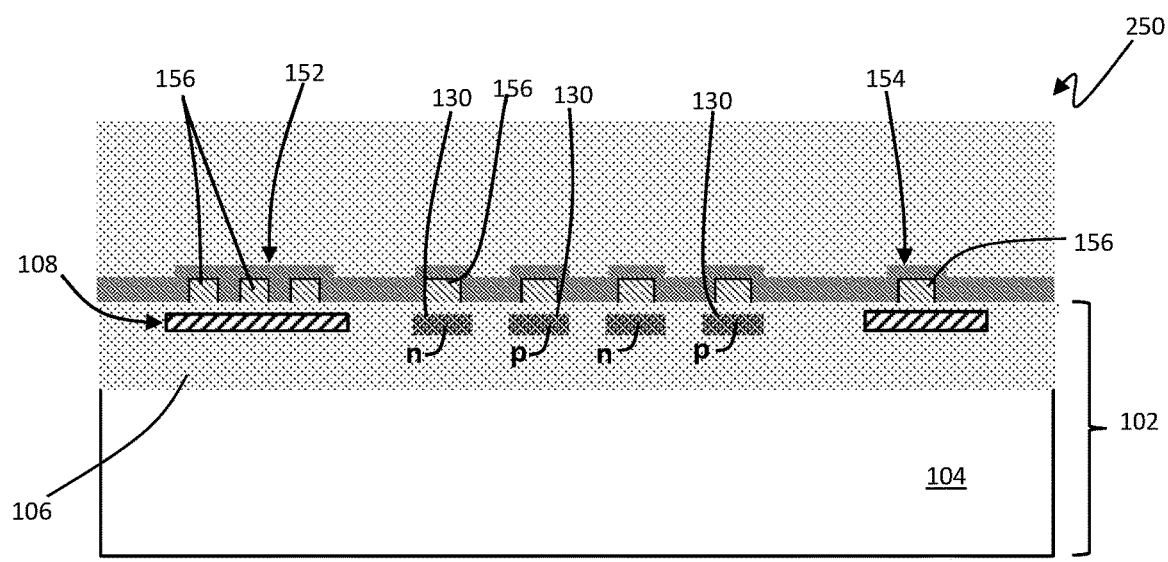
FIG. 7 shows a cross-sectional view of a structure including polycrystalline fill shape(s) and with optional alternating dopants in the fill shapes, according to other embodiments of the disclosure.

Referring to FIGS. 2, 6 and 7, an alternative embodiment according to the disclosure will be described. In this embodiment, the converting of each monocrystalline fill shape 118 to a respective polycrystalline active region fill shape 130 occurs, but the converting of upper portion 132 of monocrystalline semiconductor substrate 104 to a polycrystalline isolation region, as in FIGS. 3-5, is omitted. FIG. 2 shows implanting a dopant (arrows in FIG. 2) into, among other areas, active region segments 110. As illustrated in FIG. 6, the dopant is implanted into monocrystalline fill shape(s) 118, but in contrast to the FIGS. 3-5 embodiments, the dopant does not get implanted monocrystalline semiconductor substrate 104. In this case, as shown in FIG. 6, the implanting has sufficient energy to implant monocrystalline fill shape(s) 118, but insufficient energy to impact monocrystalline substrate 104. As in the previously-described embodiments, FIG. 6 also shows one or more thermal cycle(s), e.g., an anneal indicated by arrows, that re-orders the damaged and disordered crystallographic material into polycrystalline material. As noted, the thermal cycle(s) may include one or more intentionally added recrystallization anneal(s) shortly after implant, or the normal high temperature (>600° C.) process(es) associated with semiconductor manufacturing. In this manner, the process converts each monocrystalline fill shape 118 to a respective polycrystalline active region fill shape 130. Monocrystalline semiconductor substrate 104 remains monocrystalline. As noted, the dopant implanted may be include any material capable of creating polycrystalline material including but not limited to: germanium (Ge); a noble gas such as argon (Ar) or xenon (Xe); or a combination of the previously listed materials such as Ge—Ar or Ge—Xe.

FIG. 7 shows a cross-sectional view of a structure 250 according to alternative embodiments of the disclosure, i.e., after subsequent conventional device formation. As noted relative to FIG. 5, the subsequent processing may include any now known or later developed front-end-of-line (FEOL) semiconductor manufacturing processes to form devices, such as first active device 152 and second active device 154. Subsequent processing (only partially shown) may also include any middle-of-line (MOL) or back-end-of-line (BEOL) processing, e.g., for interconnects. As noted, processing may include, for example, cap removal, source/drain formation, gate 156 formation (active and dummy fill gates over active region fill shapes 130 by gate first or replacement metal gate processing), interlayer dielectric formation and interconnect formation (the last not shown). Active gates 156 are shown to form first active device 152 in the form of, for example, an RF device, and second active device 154 in the form of, for example, a CMOS device.

As shown in FIG. 7, in accordance with one embodiment, structure 250 includes SOI substrate 102, as described herein. Structure 250 also includes polycrystalline fill shape(s) 130 in SOI layer 108. Here, a polycrystalline isolation region (FIGS. 4-5) in semiconductor substrate 104 is omitted. First active device 152 and second active device 154 are on opposite sides of polycrystalline fill shape(s) 130. In one non-limiting example, first active device 152 may include, for example, an RF device, and second active device 154 may include a CMOS device. In any event, polycrystalline fill shapes 130 provide RF isolation of sensitive device structures (e.g., RF switches, power amplifiers, etc.) without the need for aggressive etch/implant and refill processing, significantly reducing complexity, the risk of defects and costs. Polycrystalline fill shapes 130 also provide improved passives (inductor, transmission line, metal-insulator-metal (MIM) capacitor) quality (Q) factor by decreasing eddy current in conventional monocrystalline active region fill shapes 118 (FIG. 2).

FIG. 7 also shows another alternative embodiment in which at least two polycrystalline active region fill shapes 130 optionally have alternating opposite p-type doping and n-type doping, applied to structure 250. As noted, the doping may be applied in any now known or later developed fashion, e.g., by ion implantation during source/drain formation. The p-type and n-type dopants may include any previously described elements. As noted, the alternating doping provides harmonics improvement by alternating S/D implant type between fill shapes. In any event, each fill shape 130 is separated by dielectric, creating alternating islands of p-type doping and n-type doping. Each polycrystalline fill shape 130 may include its own p/n junction, creating p/n junction islands. The dopants may be formed in the fill shapes in any now known or later developed manner, e.g., masked ion implanting.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
a semiconductor-on-insulator (SOI) substrate including a semiconductor substrate, a buried insulator layer over the semiconductor substrate, and an SOI layer over the buried insulator layer;
at least one polycrystalline active region fill shape in the SOI layer; and
a polycrystalline isolation region in the semiconductor substrate under the buried insulator layer, wherein the buried insulator layer physically separates the polycrystalline isolation region and the at least one polycrystalline active region fill shape,
wherein the polycrystalline isolation region is entirely not under a first active device and a second active device.

2. The structure of claim 1, wherein the at least one polycrystalline active region fill shape is laterally aligned over the polycrystalline isolation region.

3. The structure of claim 2, wherein the first active device and the second active device are on opposite sides of the at least one polycrystalline active region fill shape.

4. The structure of claim 3, wherein the first active device includes a radio frequency (RF) device, and the second active device includes a complementary metal-oxide semiconductor (CMOS) device.

5. The structure of claim 2, wherein a width of the polycrystalline isolation region is wider than a width of the at least one polycrystalline active region fill shape.

6. The structure of claim 2, wherein the at least one polycrystalline active region fill shape includes at least two polycrystalline active region fill shapes having a space therebetween.

7. The structure of claim 6, wherein the polycrystalline isolation region extends to a first depth into the semiconductor substrate in a first location laterally aligned with the space between the at least two polycrystalline active region fill shapes, and extends to a second depth into the semiconductor substrate in a second location not laterally aligned with the space between the at least two polycrystalline active region fill shapes, wherein the first depth is greater than the second depth.

8. The structure of claim 6, wherein the at least two polycrystalline active region fill shapes have alternating opposite p-type doping and n-type doping.

9. The structure of claim 2, wherein the at least one polycrystalline active region fill shape and the polycrystalline isolation region including a dopant selected from a group comprising: argon, xenon, germanium or a combination thereof.

10. A structure, comprising:
a semiconductor-on-insulator (SOI) substrate including a semiconductor substrate, a buried insulator layer over the semiconductor substrate, and an SOI layer over the buried insulator layer;
at least one polycrystalline active region fill shape in the SOI layer;
a first active device and a second active device, the first and second active devices on opposite sides of the at least one polycrystalline active region fill shape; and
a polycrystalline isolation region in the semiconductor substrate under the buried insulator layer, wherein the buried insulator layer physically separates the polycrystalline isolation region and the at least one polycrystalline active region fill shape,
wherein the polycrystalline isolation region includes a lowermost surface that extends to a first depth into the semiconductor substrate in a first location, and extends to a second depth into the semiconductor substrate in a second location, wherein the first depth is greater than the second depth.

11. The structure of claim 10, further comprising a first active device and a second active device, the first and second active devices on opposite sides of the at least one polycrystalline active region fill shape.

12. The structure of claim 11, wherein the polycrystalline isolation region is not under the first and second active devices.

13. The structure of claim 10, wherein a width of the polycrystalline isolation region is wider than a width of the at least one polycrystalline active region fill shape.

14. The structure of claim 10, wherein the at least one polycrystalline active region fill shape includes at least two polycrystalline active region fill shapes having a space therebetween.

15. The structure of claim 14, wherein the at least two polycrystalline active region fill shapes have alternating opposite p-type doping and n-type doping.

16. The structure of claim 10, wherein the at least one polycrystalline active region fill shape and the polycrystalline isolation region including a dopant selected from a group comprising: argon, xenon, germanium or a combination thereof.

17. A method, comprising:
forming a first device active region to one side of at least one monocrystalline active, region fill shape in a semiconductor-on-insulator (SOI) layer over a buried insulator layer over a monocrystalline semiconductor substrate and forming a second device active region to an opposite side of the at least one monocrystalline active region fill shape;
forming a mask including an opening, wherein the mask covers the first device active region and the second device active region and the opening exposes an area over the at least one monocrystalline active region fill shape, wherein each monocrystalline active region fill shape includes a cap thereover;
converting each of the at least one monocrystalline active region fill shape to a respective polycrystalline active region fill shape, wherein the converting further includes converting an upper portion of the monocrystalline semiconductor substrate to a polycrystalline isolation region, the buried insulator layer physically separating the monocrystalline active region fill shape and polycrystalline isolation region, and wherein the polycrystalline isolation region is entire not under the first device active region and the second device active region; and removing the mask.

18. The method of claim 17, wherein a width of the polycrystalline isolation region is wider than a width of the at least one polycrystalline active region fill shape.

* * * * *